(12) United States Patent
Barringer et al.

(10) Patent No.: US 7,848,109 B2
(45) Date of Patent: Dec. 7, 2010

(54) ASSEMBLY AND METHOD FOR RUGGEDIZING COMPUTER RACKS AND/OR ELECTRONIC CAGE ASSEMBLIES

(75) Inventors: Dennis R. Barringer, Wallkill, NY (US); Mark A. Brandon, Poughkeepsie, NY (US); Shawn Canfield, Poughkeepsie, NY (US); Edward F. Furey, Kingston, NY (US); John J. Loparco, Poughkeepsie, NY (US); Budy D. Notohardjono, Poughkeepsie, NY (US); John G. Torok, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 510 days.

(21) Appl. No.: 11/868,980

(22) Filed: Oct. 9, 2007

(65) Prior Publication Data

US 2009/0091880 A1    Apr. 9, 2009

(51) Int. Cl.
*H05K 5/00* (2006.01)
(52) U.S. Cl. ................... 361/724; 312/223.2
(58) Field of Classification Search ......... 361/724–727; 211/26, 191, 192; 312/223.1–223.3
See application file for complete search history.

(56) References Cited

U.S. PATENT DOCUMENTS

| | | | | |
|---|---|---|---|---|
| 2,508,032 A * | 5/1950 | Kennedy | | 211/182 |
| 3,034,844 A * | 5/1962 | Anderson et al. | | 312/265.4 |
| 3,487,948 A * | 1/1970 | Haidegger | | 211/71.01 |
| 4,464,074 A * | 8/1984 | Green et al. | | 211/182 |
| 5,372,262 A * | 12/1994 | Benson et al. | | 211/26 |
| 5,383,723 A * | 1/1995 | Meyer | | 312/265.4 |
| 5,749,476 A * | 5/1998 | Besserer et al. | | 211/26 |
| 5,819,956 A * | 10/1998 | Rinderer | | 211/26 |
| 5,979,672 A * | 11/1999 | Gemra et al. | | 211/26 |
| 6,036,290 A * | 3/2000 | Jancsek et al. | | 312/265.4 |
| 6,102,219 A * | 8/2000 | Wang | | 211/194 |
| 6,293,637 B1 * | 9/2001 | Anderson et al. | | 211/26 |
| 6,520,345 B1 * | 2/2003 | Marovic et al. | | 211/26 |
| 6,605,777 B1 * | 8/2003 | Anderson et al. | | 174/50 |
| 6,816,390 B1 * | 11/2004 | Barringer et al. | | 361/679.41 |
| 2006/0283816 A1 * | 12/2006 | Moore et al. | | 211/26 |
| 2008/0231151 A1 * | 9/2008 | Barringer et al. | | 312/223.2 |
| 2009/0040692 A1 * | 2/2009 | Barringer et al. | | 361/679 |

* cited by examiner

*Primary Examiner*—Jayprakash N Gandhi
*Assistant Examiner*—Adrian S Wilson
(74) *Attorney, Agent, or Firm*—Geraldine Monteleone; Lily Neff

(57) ABSTRACT

A method and incorporated assembly for enhancing structural rigidity of a computer rack used for housing electronic components is provided. In one embodiment, the assembly comprises a casing made of a lighter weight material and having protrusions. The protrusions are formed to receive one or more ruggedized inserts that is made of a heavier and/or stiffer material. The casing and the inserts together can be then used as a ruggedized side of a computer rack or cage.

20 Claims, 5 Drawing Sheets

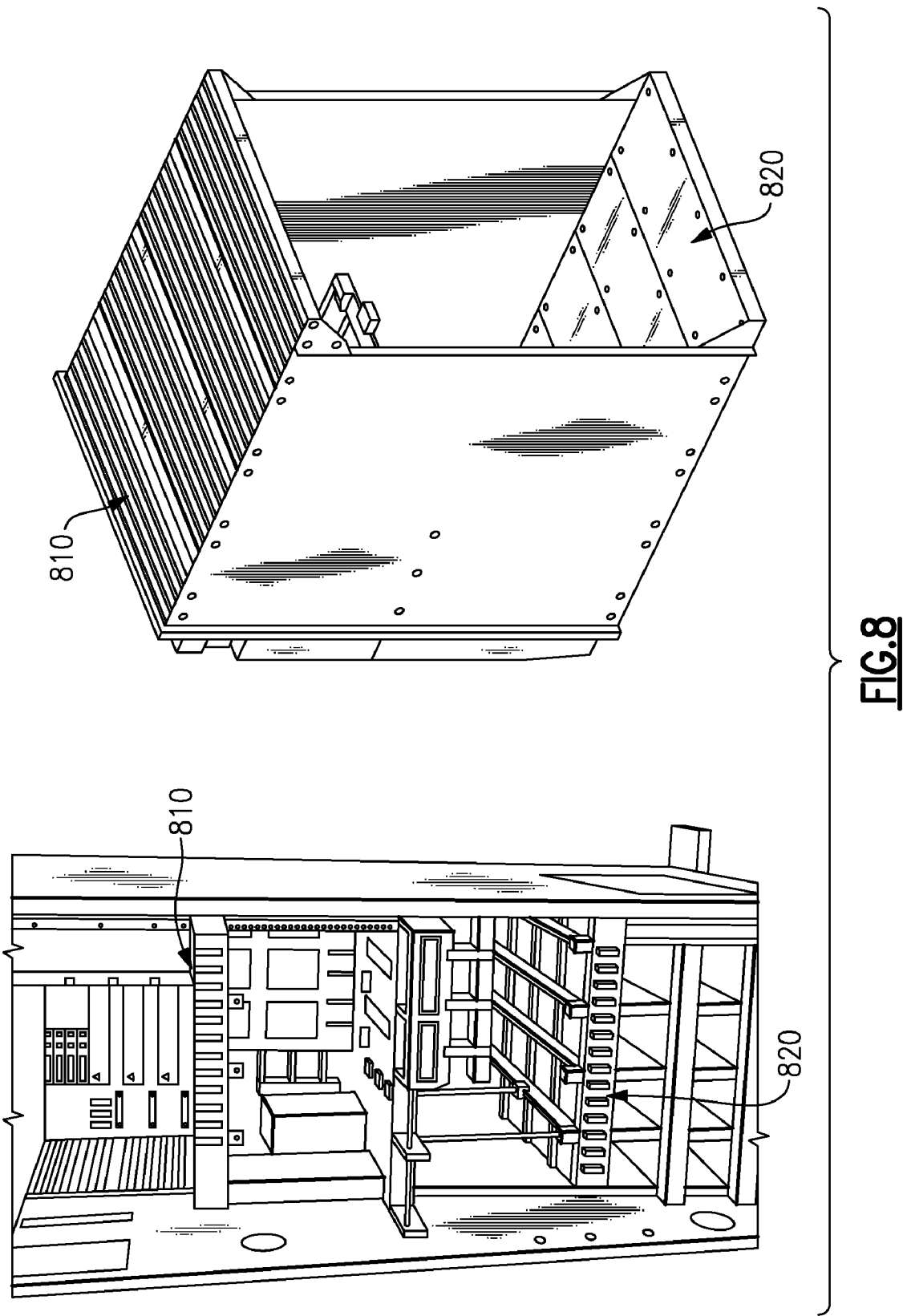

ASSEMBLY AND METHOD FOR RUGGEDIZING COMPUTER RACKS AND/OR ELECTRONIC CAGE ASSEMBLIES

BACKGROUND OF THE INVENTION

1. Field of the Invention

This invention relates to the packaging of computing systems and more particularly to a method and assembly for improving structural integrity of large computing system environments.

2. Description of Background

The industry trend has been to continuously increase the number of electronic components inside computing environments while maintaining or even reducing the environment's footprint. Computer environments can vary in range and sophistication. Simple environments can only comprise of a single computer unit while more sophisticated environments can comprise of networks of large computers that are in processing communication with one another. No matter what the size of the environment, the current industry trend has created design challenges for the developers and manufacturers of such environments. When the environments are larger and more sophisticated, however, the issues become more complex. This is because changing even the most isolated component, in such an environment, can affect so many others. This is especially true when such components are packaged together in a single assembly or housed in close proximity. A particularly difficult challenge when designing such computing system environments is the issue of mechanical and structural integrity. This is because so many other factors both depend and affect structural integrity. Heat dissipation, electrical connections, system performance and system recovery are a few such examples.

Conventional large computing system environments that incorporate one or more sophisticated units such as servers, house many electronic components together on boards that are then housed in single assembly. These assemblies often comprise of metal racks and among the many challenges discussed, dynamic loading effects of these racks and their housed electronic components need to also be considered so as not to cause electrical and mechanical failures.

In recent years, both environmental catastrophic events and man-made conditions have placed an even greater demand on the designers of computer system to provide environments that are structurally enhanced so as to be able to withstand sudden abnormal shock or persistent vibrations for long periods of time. Such factors as heat dissipation, electrical connections and others have to be considered carefully in the "ruggedization" of such environments. An environment's inability to withstand such extreme conditions may cause data loss and system collapse at a critical time, potentially affecting lives and infrastructures.

Consequently, it is desirable to introduce a solution that can provide improved ruggedized structures that can provide protection against abnormal shocks and vibrations with solutions that are permanent and effective.

SUMMARY OF THE INVENTION

The shortcomings of the prior art are overcome and additional advantages are provided through the provision of a method and incorporated assembly for enhancing structural rigidity of a computer rack used for housing electronic components is provided. In one embodiment, the assembly comprises a casing made of a lighter weight material and having protrusions. The protrusions are formed to receive one or more ruggedized inserts that is made of a heavier and/or stiffer material. The casing and the inserts together can be then used as a ruggedized side of a computer rack or cage.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 7 and 8 provide actual rack pictures and related illustrations, incorporating of ruggedized design of the embodiments of FIG. 4 through 6.

DESCRIPTION OF THE INVENTION

Figure 1:
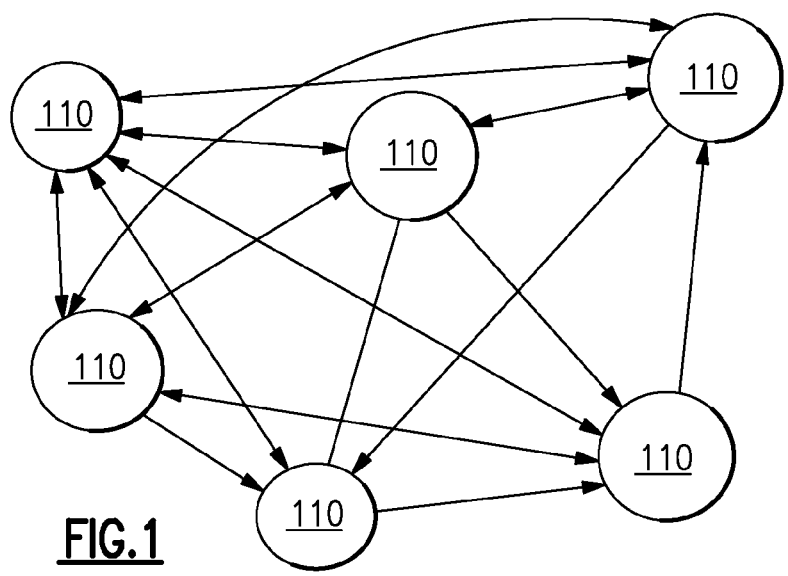
FIG. 1 is an illustration of a computing environment having a plurality of nodes.

FIG. 1 is an illustration of a computer environment having one or more nodes 110 in processing communication with one another. Each node 110 can comprise a single computer or a network of computers. A variety of electronic components are used for each node that can be housed in one or more cages as will be illustrated in other figures below.

The term cage is used to simply imply housing or an assembly that stores such components. Another name for an electronic cage is a computer processors assembly and the terms rack and frame will be used interchangeably herein to reflect similar housing arrangements for the cage. The cage terminology refers to the manner that most conventional large computer housing structures are built and consists like a chassis like structure that is used for housing electronic units. Most conventional cage structures often comprise of a rigid outer housing often with drawer chassis or other similar arrangements that help loading and unloading of motherboards and other electronic components that are being housed inside. It should be noted, that although because of the popularity of this arrangement, a cage housing structure is used in the present invention to provide better understanding, other arrangements can be similarly supported by the workings of the present invention.

Referring back to FIG. 1, in times, a single cage can be associated with a single node 110 but that is not always the case as appreciated by those skilled in the art. It should also be noted that a single cage can comprise several nodes, while several cages can also constitute a single node.

Figure 2:
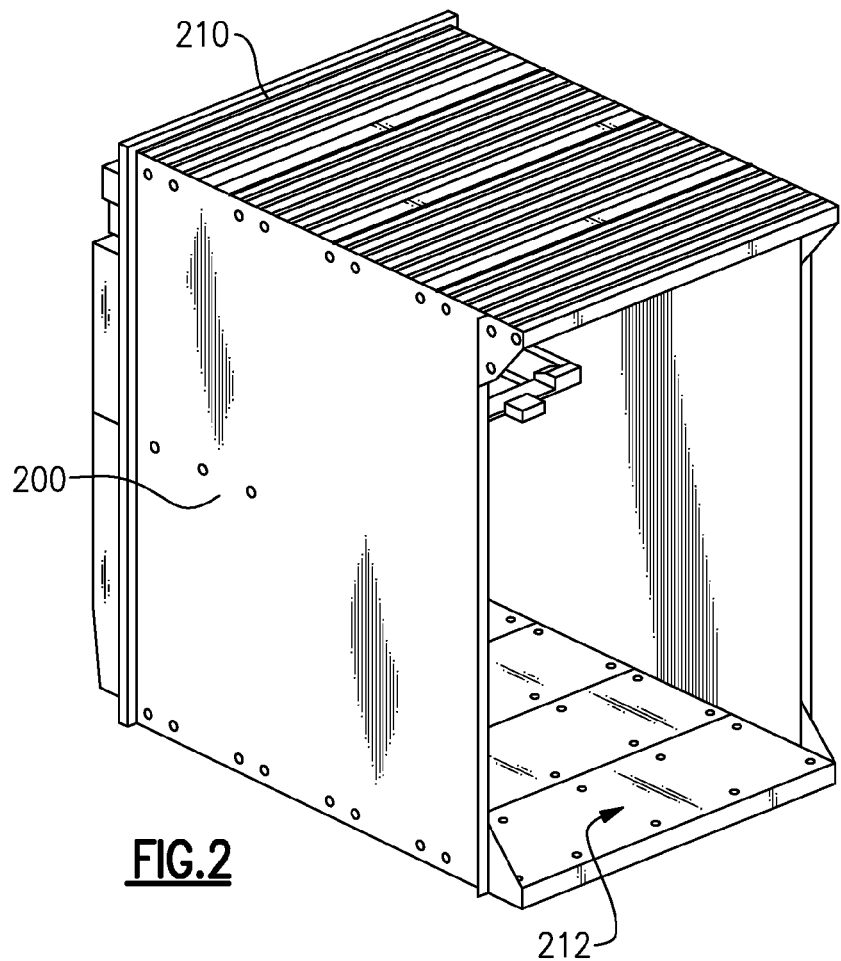
FIG. 2 is an illustration of a rack or frame housing electronic components having a ruggedized top and bottom surfaces as per one embodiment of the present invention.

FIG. 2 provides an embodiment of the present invention where a cage housing structure 200, also referred to as housing 200 or cage 200 interchangeably, is used for the electronic components such as CECs and other such units not shown in this illustration. Most cages or housings that support large computing system environments have a limited footprint to allow for interchangeability of mother boards and electronic components in general. The footprint for many conventional computing system environments is approximately 22 inches wide, 32 inches deep and 36 inches high.

In addition to housing electronic components, cage structures or housings used in large computing environments serve a variety of other purposes. The most notable is to provide structural rigidity so that heat dissipation or a variety of other elements such as dynamic loading does not cause electrical shorts that interfere with system operation. In addition to carrying the dynamic loads, many such housings (i.e. cages or racks) are also design to carry static charges.

An example as provided by the illustration of FIG. 2 can enhance understanding of this concept. In the embodiment of FIG. 2, an exemplary case is illustrated the particular cage 200 houses up to 8 nodes. Obviously, in alternate embodiments the number of nodes can vary and more or less nodes can be provided. In many conventional cases, however, the casings support on average about four nodes. The weight of the nodes depend on the particular needs of and varies, but most nodes weigh approximately somewhere close to 125 lbs. For a four node arrangement, one can easily see that a substantial weight is being supported and as will be discussed later in more detail, this provides even more support for the need of a ruggedized but light weight solution as provided by the present invention.

Referring back to FIG. 2, as discussed before, parts of the cage 200—in this case the top and bottom cage chassis, referenced as 210 and 212 respectively, are intended to carry the static and dynamics loads of these 8 nodes. In many conventional designs the thickness of the cage chassis is usually limited due to limited space available. Realistically, given the space constraints of many designs today, in many instances this thickness can not be any greater than 30 mm maximum.

Figure 3:
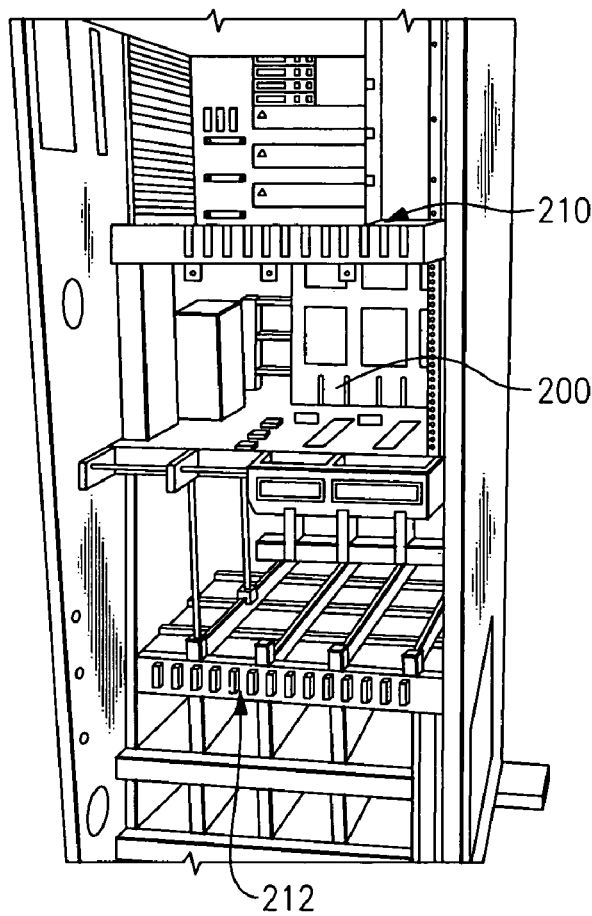
FIG. 3 is a picture of an actual rack or cage similar to the one depicted in FIG. 2 installed in a rack or frame.

FIG. 3 is a picture of an actual rack or cage similar to the one depicted in FIG. 2. This picture is provided to ease understanding and provides a similar embodiment to the one discussed in conjunction with FIG. 2. For this reason and to easily correlate the different components of this figure to that of FIG. 2, similar reference numerals are used in both figures.

In both FIGS. 2 and 3, the ruggedized side used is depicted to represent a top surface 210 as illustrated. This is provided only as way of example, however, and the ruggedized side can be used in a variety of different arrangements.

Figure 4:
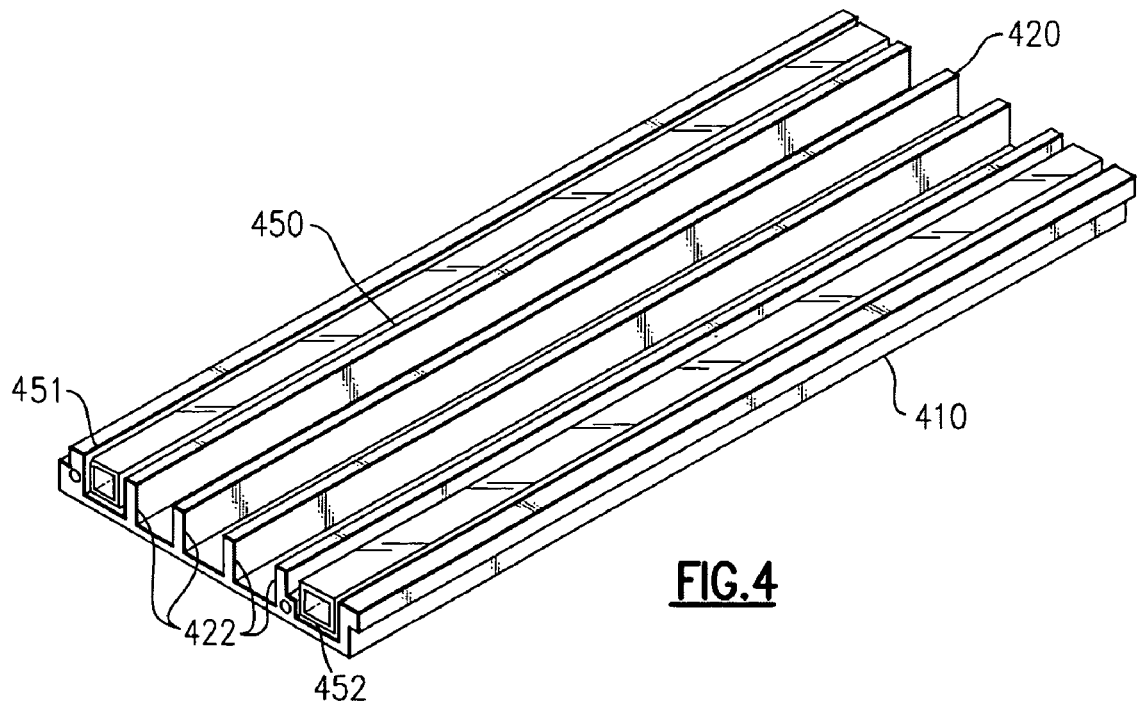
FIGS. 4 thought 6 provide different perspective illustrations for the detailed design of a ruggedized side such as the one provided in FIG. 2.
Figure 5:
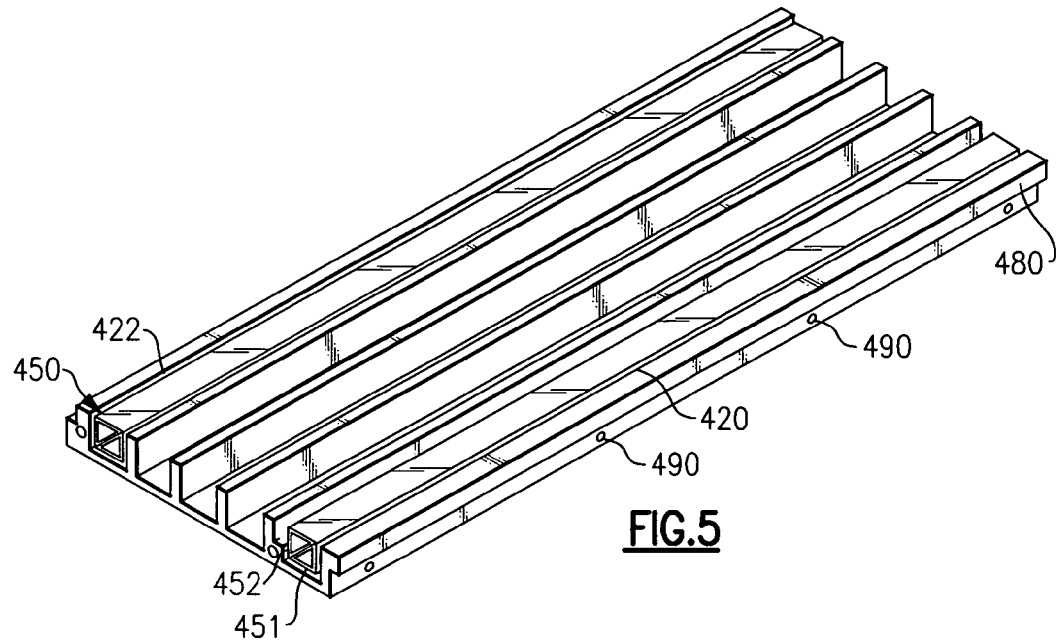
Figure 6:
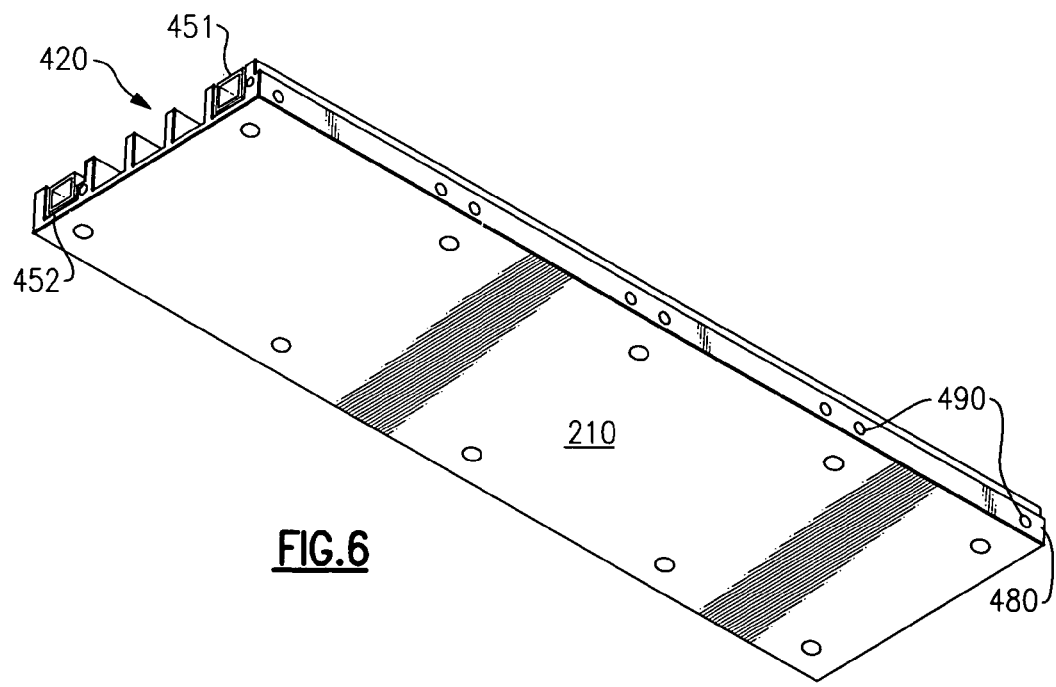

FIGS. 4 through 6 provide a more detailed illustration of the ruggedized side discussed in conjunction with the illustrations of FIGS. 2 and 3. As discussed since the ruggedized side does not have to be used only as a top or bottom surfaces, the referenced numerals in FIGS. 4 through 6 have been slightly changed to indicate this concept. For example, in the illustrations of FIG. 4 through 6, a ruggedized side is referenced by numerals 410 which will substitute the side used as a top surface in FIGS. 2 and 3 which was referenced by numerals 210. Ruggedized side 410 of FIGS. 4 through 6 can be used in any, all or a combination of all surfaces of a computer cage or rack. In other embodiments, where a door or front and end panels are also used in conjunction with the rack or housing 200, a $5^{th}$ and a $6^{th}$ side can also be added selectively to further enhance the rigidity of the unit. Other designs can also be incorporated if the particular housing has more or less side surfaces. It should be noted also that although the ruggedized side 410 can be used as a single side to the cage in these illustrated embodiments, a side of a cage can also incorporate a plurality of such ruggedized sides 410. In that case the ruggedized sides 410 will be secured to one another and the cage using methods known to those skilled in the art, including but not limited to bolting, screwing, welding and the like.

Similarly, a variety of methods known to those skilled in the art can be used also to secure the side(s) 410 to the housing 200 or to one another when such sides 410 are used as a single side entity. Again and as before, these may include but are not limited to screwing, bolting, welding and the like.

In one embodiment of the present invention as provided in reference with the illustration of FIG. 4, the enhanced side 410 is made from a combination of a light and a stiff material to provide rigidity to the structure without unduly adding to the weight. The weight of the rack or the housing 200 is of constant concern in shipping and maintenance of racks. A heavy rack, while provides structural rigidity, is hard to ship and to store. The weight issue also interferes with proper maintenance and service calls. The heavier the weight of the rack the more resources, including human resources are needed to properly handle these operations. The storage of many racks in a single establishment such as a data call center or the like can also provide a difficulty for the operators of such environments as extra measures need to be taken in the building of environments that stores them.

Referring back to FIG. 4, as mentioned a lighter almost corrugated design is provided. In this particular arrangement, the protruding parts 422 (i.e. extrusions) of a casing 420 are made of a lighter material such as aluminum while one or more stiffer insert(s) 450 made of a more rigid material such as steel is provided to increase the structural rigidity. It should be noted that the protruding parts, can be made of material fabrications such that they appear as extrusions machine to print, casting design etc. The shape of the insert 450 and the casing 420 are provided such that they can easily complement one another. The casing, in other words, is formed to receive the insert. For example as can be seen in the illustrated figure, in this particular embodiment rectangular shaped extrusions 422 are provided such that they can complement the rectangular shaped insert tubings 450.

In addition, the insert (i.e. tubings) 450 can also be disposed only between some extrusion interval as shown in the illustrated figures or be altered in a variety of different manners to optimize weight of rigidity according to specific needs. In one embodiment, the tubing can be provided in all intervals. In the embodiments shown, the insert (tubing) are only provided on each side of the casing 420. In this embodiment, 2 inserts are used for each casing with the understanding that a variety of other arrangements and embodiments are possible.

Furthermore, as will be discussed later, the tubing can comprise of different components itself. In the preferred embodiment, provided in the illustrated figures, two tubings of rectangular shape is provided as referenced by 451 and 452. More discussion will be provided later in regard to the design of the tubing inserts below.

FIGS. 5 and 6 provide different views of the embodiment of FIG. 4. While FIG. 5 provides another top down perspective illustration of the embodiment of FIG. 4 from a different angle, FIG. 6 provides a bottoms up view to illustrate that in this particular embodiment, the extrusions are attached to a solid surface forming the entire casing 420. The light material of the aluminum (or other light casing substance) allows for this design while not adding much to the weight. The rigidity of the stiff inserts 450 as will be now discussed in more detail will provide for the stiffness that is desired to keep the lighter casing material from warping or giving in under the load pressures.

In the embodiment of FIG. 4 and FIG. 5, the stiff insert 450 is made of tubing as discussed earlier. In one embodiment, the tubings may be multiangular, such as triangular, hexagonal, rectangular etc. shaped. Foe ease of understanding, in this particular embodiment, as stated, two triangular shaped tubing further shown as 451 and 452 are used but this is one of many possible embodiments. The two tubings for this embodiment are provided to enhance surface area and add to the structural rigidity of the tubing portion. In addition, as provided in the illustrated embodiments, the arrangement of the tubings 451 and 452 can be varied to accommodate the design of the casing and enhance the rigidity even further due to the direction of forces. In the embodiment shown in the figures, the rectangular tubings 451 and 452 are placed adjacent to one another in a manner that their (shared) adjacent sides form the diagonal of a parallelogram. It should be noted, however, than the embodiment shown is only one of many embodiments that are possible and many different kind of tubings having many different designs can be incorporated to selectively enhance the rigidity or alternatively reduce the overall weight of the side 410. Furthermore, the number of insert tubings 450 can vary and a single tubing or a plurality of them can be provided in alternate embodiments.

The inserts 451 and 452, in the embodiments provided in FIGS. 4 through 6 comprise a hollow center which is the reason they are referred to herein as tubings. The thickness of the material and the diameter of the hollow center can be selectively changed to provide more or less rigid inserts. The need for an increase or decrease in rigidity is compared to a need to add or take away from the weight of the inserts and the ruggedized side in general. In extreme cases, the inserts may even be fabricated of solid units with no hollowed centers.

To summarize, in the embodiment illustrated in the figures, the two inserts 450 each comprising of components 451 and 452 are provided at each end of the casing 420 to provide optimal rigidity with a minimum of inserts. In this case the inserts are shown to have a hollow center. This particular arrangement is selected for a preferred embodiment as shown and discussed with the understanding that as stated above, different embodiments can be selectively implemented that have different arrangement of inserts with different shapes and numbers. In addition, when a plurality of inserts are used or when the enhanced and ruggedized side 410 is uses together with other sides 410, the shape and size of the casing and inserts can vary for each side 410. It is even possible to have differently shaped inserts on a single side 410 depending on the particular needs of an application.

In the following table, referenced as Table 1, a list of different tube geometries and thicknesses are provided for better understanding of the above mentioned concepts. However, it should also be understood that the entries of table 1 are also provided as examples and should not be considered in anyway to limit the workings of the present invention.

TABLE 1

Geometry of tubings and casings vs. weight and rigidity

| Geometry Case | Weight of Geometry (kg.) | Max. Deflection (mm.) 100 load, 50G acceleration/ (normalized to case 3) | Max Deflection (mm.) 100 lb load, no gravity/ (normalized to case 3) |
|---|---|---|---|
| Aluminum Casting: no square tube stiffeners | 3.59 | 1.95e−01 (1.32) | 9.16e−03 (3.22) |
| Aluminum Casting: with 3 square tube stiffeners | 7.28 | 8.73e−02 (1.02) | 3.78e−03 (1.33) |
| Aluminum Casting: with 5 square tube stiffeners | 9.73 | 6.83E−02 (1.00) | 2.84e−03 (1.00) |
| Solid Aluminum Casting | 9.41 | 9.18E−02 (1.31) | 3.87e−03 (1.36) |
| Solid Steel Casting | 26.67 | 4.28E−02 (1.24) | 1.37e−03 (0.48) |

It should be also noted that while in the example(s) of the embodiment discussed in conjunction with FIGS. 4 through 6, as way of example it was mentioned that aluminum can be used as an example of a lighter material and steel can be used to increase the stiffness of the assembly. While there are many advantages in using both aluminum and steel, these are only examples of some materials that can be used and the workings of the present invention shall not be only limited to steel and aluminum.

Referring back to FIG. 4 though 6, in one embodiment the casing 420 can also be formed to be easily incorporated into the rack or cage design as indicated by sides 480. Mounting means are also provided illustratively by references 490 but other arrangements are possible in different embodiments.

Figure 7:
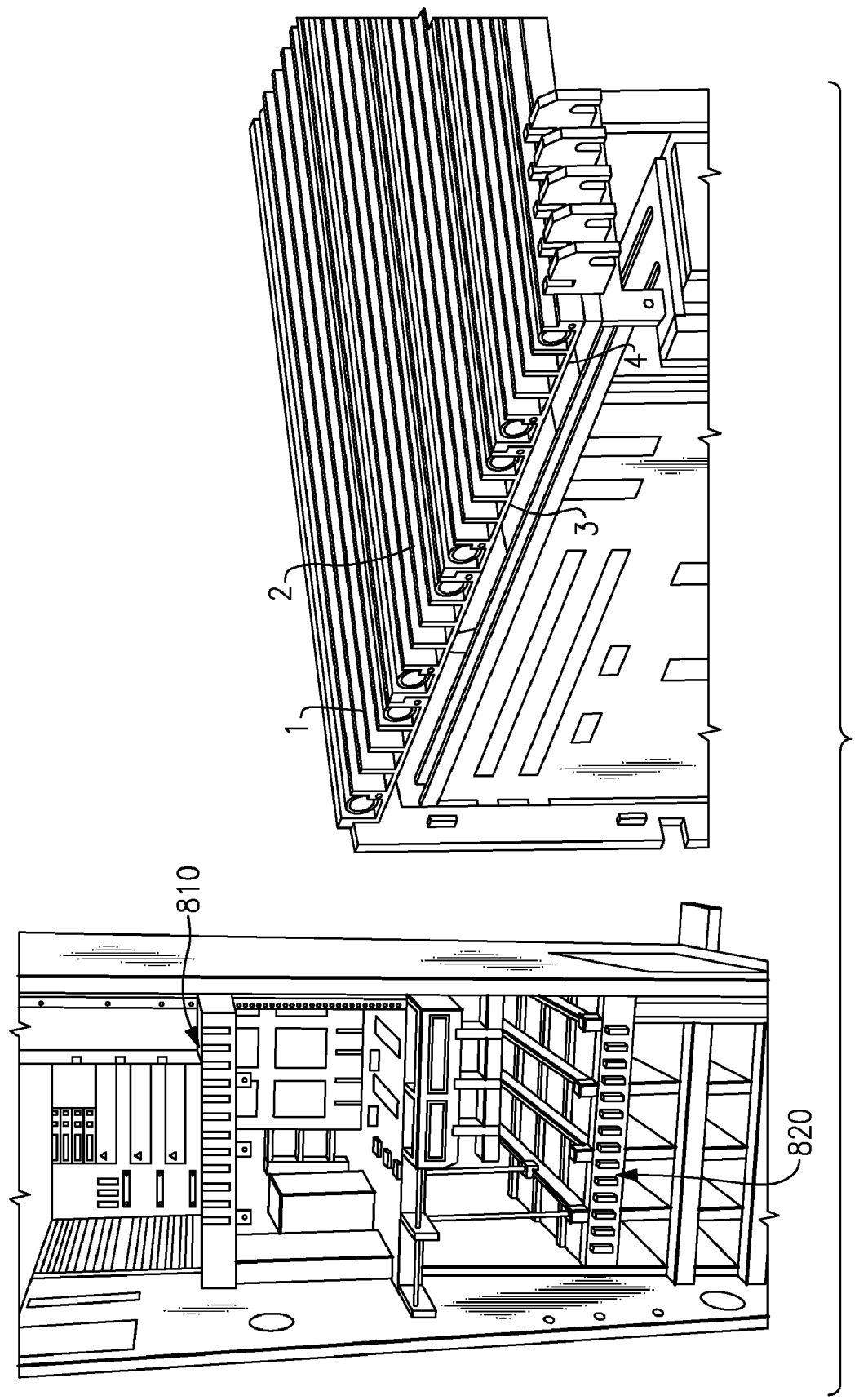

FIGS. 7 and 8 show actual rack pictures using the ruggedized design as their top and/or top and bottom surfaces or sides (FIG. 8 particularly). Illustrations are also provided to better correlate these actual pictures to the concepts discussed earlier.

Referring to FIG. 7, a more detailed picture of the racks are then provided similar to that of FIGS. 2 and 3 to indicate the that the ruggedized side is used as a top surface. In FIG. 7, however, an alternate design is provided with 4 cage plates referenced separately. The top surface in both FIGS. 7 and 8 are indicated as 810 and the bottom surface as 820. As indicated, these are only a few of the embodiments as provided by the workings of the present invention and other and alternate designs incorporating the ruggedized side in their other surfaces or sides are possible.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An assembly for enhancing structural rigidity of a computer rack used to house electronic components comprising:
a casing made of a light weight cast metal, said casing having a continuous planar major surface and a plurality of protrusions extending away from said major surface at regular spacings such that each of a plurality of respective pairs of adjacent protrusions define first and second wall surfaces of each of a plurality of channels:
one or more inserts fabricated of a stiffer material than said casing, each insert having a stiffness greater than said stiffness of said casing, and each insert being disposed within one of said channels of said casing in contact with the major surface and each of said first and second wall surfaces so as to stiffen said casing;

said casing and each insert together being capable of being used as at least part of a side of said computer rack.

2. The assembly of claim 1 wherein said channels of said casing are open at said edges of said wall surfaces remote from said major surface and said channels and each said inserts have complementary designs such that each said one or more insert fits securely into said channels.

3. The assembly of claim 1, wherein said one or more insert has a hollow center and a diameter of at least one said hollow center can be selectively altered.

4. The assembly of claim 1, wherein said major surface of said casing extends in horizontal directions and said protrusions extend in a vertical direction away from said major surface.

5. The assembly of claim 3, wherein at least one said insert is comprised of a plurality of components.

6. The assembly of claim 3, wherein said insert further comprises a plurality of multiangular shaped tubings disposed adjacent to one another each of said plurality of said tubings including elongated surfaces extending in a direction of a length of said channels, said elongated surfaces of at least first and second multiangular shaped tubings contacting one another within a channel and forming a diagonal of a parallelogram.

7. The assembly of claim 6, wherein each of said first and second multiangular tubings has a triangular cross-section.

8. The assembly of claim 1, wherein at least one said insert has a rectangular cross-section.

9. The assembly of claim 6, wherein a plurality of inserts are used at each end of said casing.

10. The assembly of claim 1, wherein said casing is comprised of aluminum or aluminum compounds.

11. The assembly of claim 1, wherein said casing is comprised of steel or steel compounds.

12. A ruggedized computer rack for housing electronic components comprising:

a ruggedized side, said ruggedized side including a casing made of a light weight cast metal, said casing having a continuous planar major surface and a plurality of protrusions extending away from said major surface at regular spacings such that said protrusions of each of a plurality of respective pairs of adjacent protrusions define first and second wall surfaces of each of a plurality of channels, one or more inserts fabricated of a stiffer material than said casing, each insert having a stiffness greater than a stiffness of said casing, and each insert being disposed within one of said channels of said casing in contact with said major surface and each of said first and second wall surfaces so as to stiffen said casing.

13. The rack of claim 12, wherein said ruggedized side is disposed at a top of said rack such that said major surface extends in a direction of a top surface of said rack.

14. The rack of claim 12, wherein said ruggedized side is disposed at a bottom of said rack such that said major surface extends in a direction of a bottom surface of said rack.

15. The rack of claim 13, said rack further comprising a second one of said ruggedized sides disposed at a bottom of said rack such that said major surface thereof extends in a direction of a bottom surface of said rack, and further comprising at least third and fourth ones of said ruggedized sides, each of said third and fourth ruggedized sides extending between said bottom ruggedized side and said top ruggedized side.

16. The rack of claim 12, wherein said casing is made of aluminum.

17. The rack of claim 16, wherein said inserts are tubular in shape and comprised of steel.

18. A method of ruggedizing a computer rack used to house electronic components comprising: forming at least a portion of one side of said rack to include a casing made of a light weight cast metal, said casing having a continuous planar major surface and a plurality of protrusions extending away from said major surface at regular spacings, such that said protrusions of each of a plurality of respective pairs of adjacent protrusions define first and second wall surfaces of each of a plurality of channels, one or more inserts fabricated of a stiffer material than said casing, each insert having a stiffness greater than said stiffness of said casing, and each insert being disposed within one or said channels of said casing in contact with said major surface and each of said first and second wall surfaces so as to stiffen said rack.

19. The method of claim 18, wherein said at least one insert further comprises a plurality of multiangular shaped tubings disposed adjacent to one another, each of the plurality of tubings including elongated surfaces extending in a direction of a length of said channels, said elongated surfaces of at least first and second multiangular shaped tubings contacting one another within a channel of said plurality of channels and forming a diagonal of a parallelogram.

20. An assembly as claimed in claim 19, wherein each of said first and second multiangular tubings has a triangular cross-section.

* * * * *